(12) United States Patent
Gumm

(10) Patent No.: US 8,372,226 B2
(45) Date of Patent: Feb. 12, 2013

(54) ELASTOMERIC WATERPROOFING AND WEATHERPROOFING PHOTOVOLTAIC FINISHING METHOD AND SYSTEM

(76) Inventor: Michael L Gumm, Santa Cruz, CA (US)

(*) Notice: Subject to any disclaimer, the term of this patent is extended or adjusted under 35 U.S.C. 154(b) by 341 days.

(21) Appl. No.: 12/684,544

(22) Filed: Jan. 8, 2010

(65) Prior Publication Data

US 2010/0126651 A1    May 27, 2010

Related U.S. Application Data

(63) Continuation of application No. 11/682,163, filed on Mar. 5, 2007, now Pat. No. 7,666,466, which is a continuation-in-part of application No. 11/533,752, filed on Sep. 20, 2006, now abandoned.

(60) Provisional application No. 60/797,248, filed on May 3, 2006, provisional application No. 60/800,945, filed on May 17, 2006, provisional application No. 60/808,704, filed on May 26, 2006.

(51) Int. Cl.
*E04D 13/18* (2006.01)
*H01L 31/042* (2006.01)
*B05D 5/12* (2006.01)

(52) U.S. Cl. ........... 156/71; 52/173.3; 136/244; 427/74; 438/64

(58) Field of Classification Search ............ 427/74; 156/71; 438/64; 136/243, 251, 259, 291, 136/244; 52/173.3

See application file for complete search history.

(56) References Cited

U.S. PATENT DOCUMENTS

| | | | |
|---|---|---|---|
| 6,307,145 B1* | 10/2001 | Kataoka et al. | 136/251 |
| 2001/0003625 A1* | 6/2001 | Apgar et al. | 428/519 |
| 2001/0008910 A1* | 7/2001 | Yu et al. | 524/5 |
| 2005/0005534 A1* | 1/2005 | Nomura et al. | 52/90.2 |
| 2005/0133082 A1* | 6/2005 | Konold et al. | 136/246 |
| 2005/0214963 A1* | 9/2005 | Daniels et al. | 438/29 |

* cited by examiner

*Primary Examiner* — James Lin
(74) *Attorney, Agent, or Firm* — Patwrite Law; Mark David Torche

(57) ABSTRACT

The present invention is for a system and method of creating a continuous, seamless, waterproof, weatherproof, electrically generating surface that can be applied over a great variety of structural components. The method comprises coating the selected surface with a base elastomeric coating thus sealing holes, cracks and other surface imperfections. In one embodiment, the base elastomeric coating is allowed to dry and at least one photovoltaic module is placed on the base elastomeric coating by using another coat of elastomeric material applied to the underside surface of the photovoltaic module or on the surface of the base elastomeric coating where the photovoltaic module will be applied. Another layer of an elastomeric coating is applied covering the perimeter edges of the photovoltaic module creating a continuous, seamless, waterproof, weatherproof surface capable of generating electricity. Other embodiments include various strengthening elements to create durable, weatherproof surfaces with the photovoltaic modules integrated therein.

8 Claims, 21 Drawing Sheets

ELASTOMERIC WATERPROOFING AND WEATHERPROOFING PHOTOVOLTAIC FINISHING METHOD AND SYSTEM

CROSS REFERENCE TO RELATED APPLICATIONS

This application is a continuation of U.S. patent application Ser. No. 11/682,163, filed Mar. 5, 2007 now allowed, which is a continuation-in-part of U.S. patent application Ser. No. 11/533,752 filed Sep. 20, 2006, which in turn claims priority to Provisional Application Ser. No. 60/797,248, filed on May 3, 2006, 60/800,945, filed on May 17, 2006 and 60/808,704, filed on May 26, 2006, the complete disclosures of each of which are hereby incorporated by reference.

BACKGROUND OF THE INVENTION

Shelter is a basic human necessity with caves and trees no doubt serving as the earliest form of protection from the elements. One important function of a roof or wall is keeping rain or snow outside the dwelling. While caves served this purpose reasonably well, other structures proved more difficult to weatherproof. Additionally, although modern building techniques have overcome these problems, exterior surfaces still age and are subject to leaks. A leaking exterior surface can prematurely age an existing structure and require extensive repairs or complete replacement. It is known to apply weatherproofing materials to exterior surfaces in an attempt to stop leaks and extend the life of the structure.

Unlike the caves and tree houses of our ancestors, modern dwellings require energy to keep them comfortable. In the past houses were heated by means of a fire in fireplaces and stoves but today's houses are not only heated but cooled keeping our homes and places of business at a comfortable temperature year-round. In the United States the cost of energy has traditionally been relatively low and our dwellings are kept comfortable using a variety of energy sources such as natural gas, electricity, propane, fuel oil, kerosene, etc. As the cost of energy rises, interest in alternative energy sources has risen and become economically feasible in many cases. One area that is experiencing rapid growth due to technological advances in the field is the use of photovoltaic surfaces to generate electricity. Originally photovoltaic modules tended to be heavy and fragile but today's photovoltaic modules are thin, flexible and durable allowing them to be used in many more applications than in the past.

There is a need for a system that can weatherproof a surface as well as incorporating photovoltaic modules therein to create a durable weatherproof layer for either new construction or retrofits.

SUMMARY OF THE INVENTION

The present invention is for a system and method of creating a continuous, seamless, waterproof, weatherproof, electrically generating surface that can be applied over a great variety of structural components. The method comprises coating the selected surface with a base elastomeric coating thus sealing holes, cracks and other surface imperfections. In one embodiment, the base elastomeric coating is allowed to dry and at least one photovoltaic module is placed on the base elastomeric coating by using another coat of elastomeric material applied to the underside surface of the photovoltaic module or on the surface of the base elastomeric coating where the photovoltaic module will be applied. Another layer of an elastomeric coating is applied covering the perimeter edges of the photovoltaic module creating a continuous, seamless, waterproof, weatherproof surface capable of generating electricity. Other embodiments include various strengthening elements to create durable, weatherproof surfaces with the photovoltaic modules integrated therein.

Other features and advantages of the instant invention will become apparent from the following description of the invention which refers to the accompanying drawings.

DETAILED DESCRIPTION OF THE INVENTION

Figure 1:
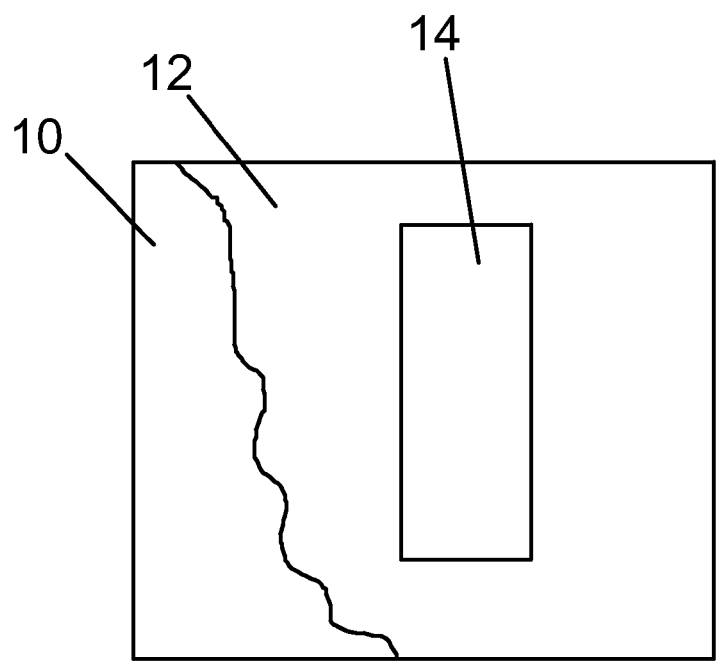
FIG. 1 is a top view of a surface treated according to an embodiment of the present invention.

Reference is now made to the drawings in which reference numerals refer to like elements. The present invention is used to weatherproof most kinds of surfaces such as but not limited to masonry, concrete block, tilt-wall, pre-cast forms, poured concrete, pre-stressed concrete, post tensioned concrete, cementitious, EIFS, corrugated panels, wood, and roofing materials.

Figure 2:
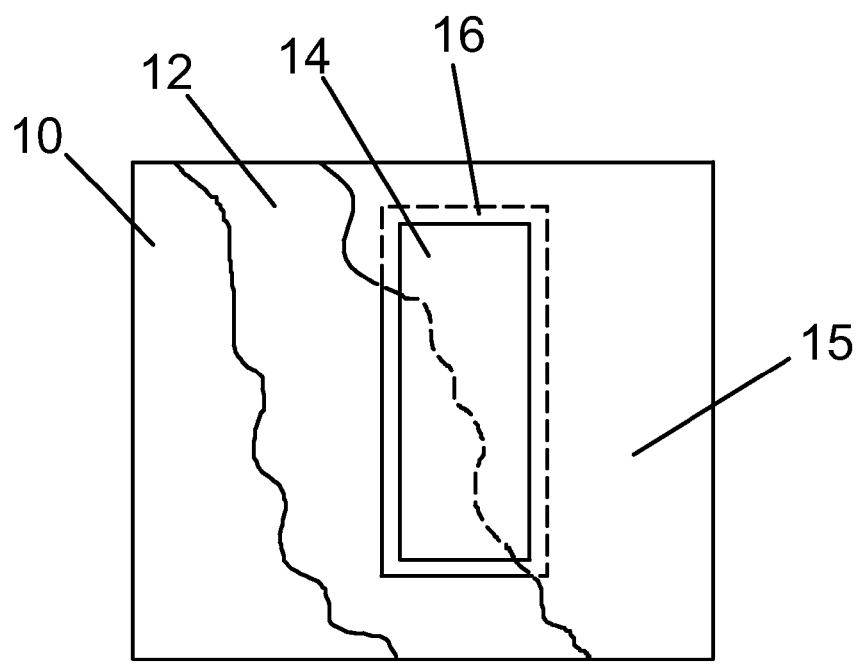
FIG. 2 is a top view showing the next step of the surface treated according to an embodiment of the present invention.

Referring now to FIGS. 1 and 2, a surface 10 is coated with an elastomeric base coat 12 to cover at least a portion of surface 10. Elastomeric base coat 12 covers cracks, holes and other surface imperfections thus rendering surface 10 impervious to rain, snow and other weathering effects. Next a photovoltaic module 14 is pressed against elastomeric base coat 12 before elastomeric base coat 12 sets up. Photovoltaic module 14 thus adheres to elastomeric base coat 12. Photovoltaic module 14 can be a flexible roll out module, semi-flexible fan fold module or a semi-flexible or rigid flat module panel as is known in the art.

Next, another elastomeric coat 15 is applied over elastomeric base coat 12 and around the perimeter 16 of photovoltaic module 14 thus completely sealing photovoltaic module 14 and creating a continuous, seamless, waterproof and weatherproof surface capable of generating electricity.

Figure 3:
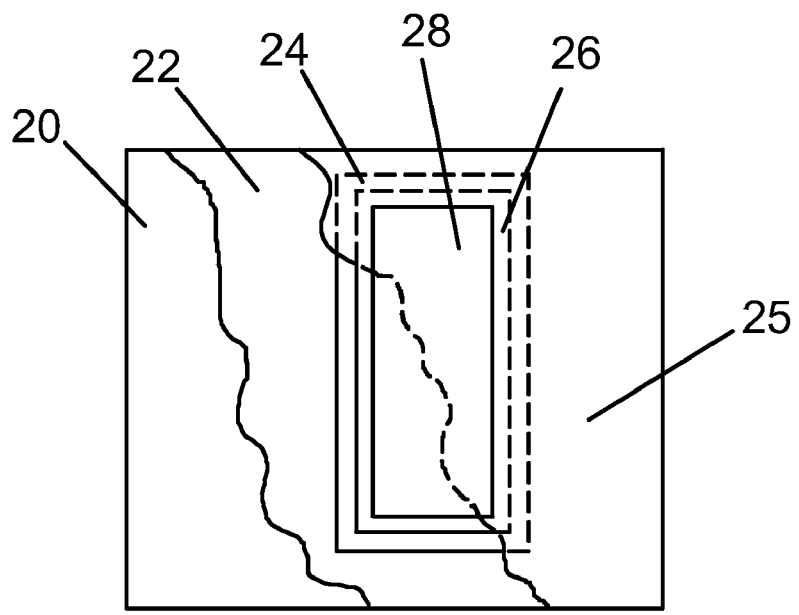
FIG. 3 is a top view of a surface treated according to yet another embodiment of the present invention.

According to another embodiment, FIG. 3 illustrates the present invention with the addition of a structural element 24 to increase the bonding and mechanical properties of photovoltaic module 28. Structural element 24 can be a fabric mesh such as a reinforced polyester mesh, flashing fabric, semi-flexible or rigid thin polymer, fiber or cementitious backerboard or other synthetic fabric as is known in the art. Structural element 24 may be factory applied to photovoltaic module 28 or they may be field applied by the installation technician. The purpose of structural element 24 is to provide additional bonding and stability for photovoltaic module 28. As before, an elastomeric base coat 22 is applied over a surface 20 to provide a weatherproof surface. Structural element 24, which is generally larger than photovoltaic module 28, is then placed against elastomeric base coat 22 while it is still wet. If additional strength is needed, structural element 24 may be placed over the entire surface 20. If sufficient elastomeric material penetrates structural element 24, then photovoltaic module 28 may be placed directly on structural element 24 thus providing the necessary bonding. It may be desirable in some applications to apply more elastomeric material over structural element 24 before placing photovoltaic element 28 to ensure bonding. Then as discussed above, another elastomeric coat 26 is applied around the perimeter of photovoltaic element 28 providing a continuous, seamless, waterproof and weatherproof surface capable of generating electricity. In other embodiments, photovoltaic element 28 may be supplied with a self stick adhesive or a field applied adhesive on a back surface to aid adhesion.

Figure 4:
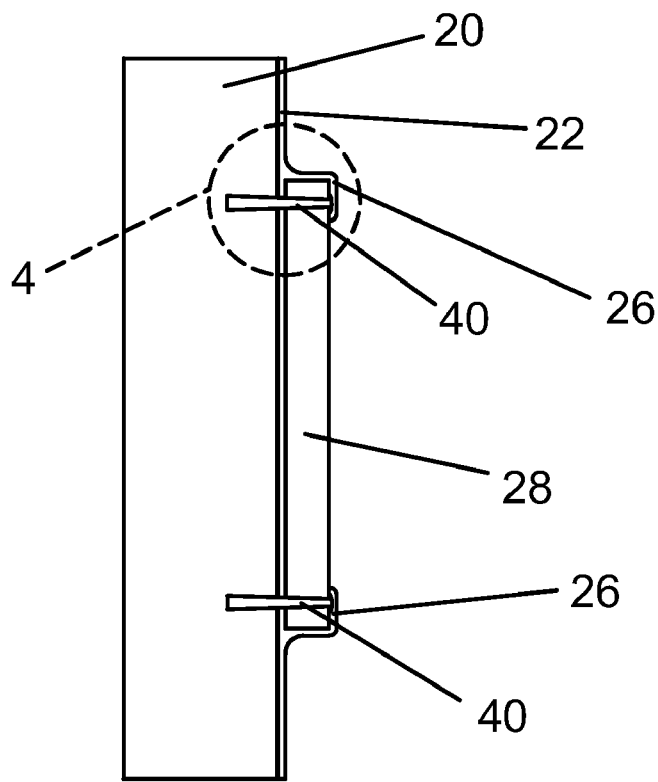
FIG. 4 is a side view of a structurally reinforced photovoltaic module according to an embodiment of the present invention.
Figure 5:
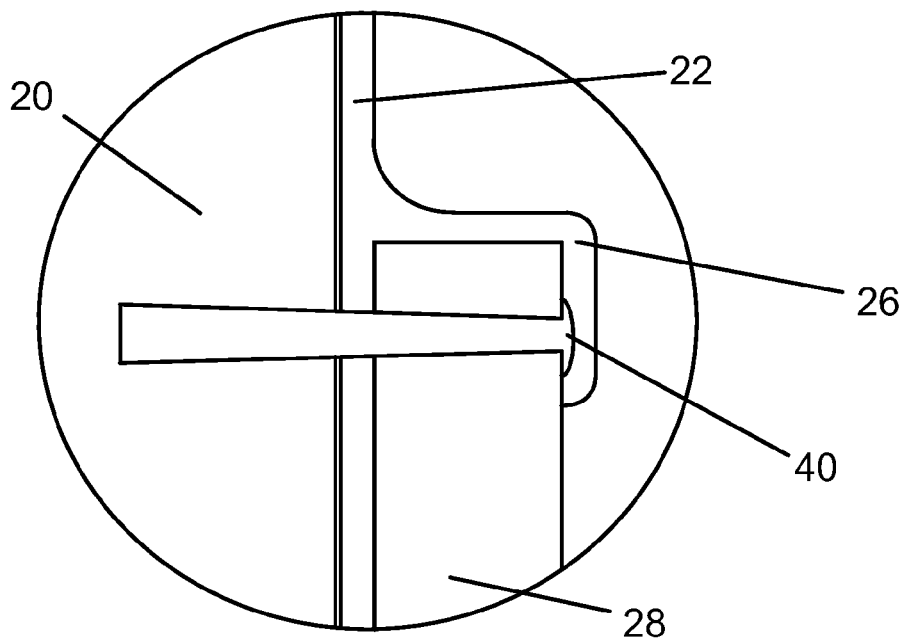
FIG. 5 is a detailed view of the section shown in FIG. 4.

Referring now to FIGS. 4 and 5, an embodiment of the present invention is shown utilizing mechanical structural element 40 to aid in securing photovoltaic element 28 in addition to improving the bonding strength of elastomeric base coat 22. Mechanical structural element 40 may be a bolt, expander, anchor or any other suitable support element capable of holding photovoltaic element 28 to surface 20 as is known in the art. Mechanical structural element 40 provides additional support especially before elastomeric base coat 22 and another elastomeric coat 26 are fully cured. As can be seen in detail in FIG. 5, mechanical structural element 40 is also covered by elastomeric coat 26 thus providing a continuous, seamless, waterproof and weatherproof surface completely sealing surface 20 as well as photovoltaic element 28.

Figure 6:
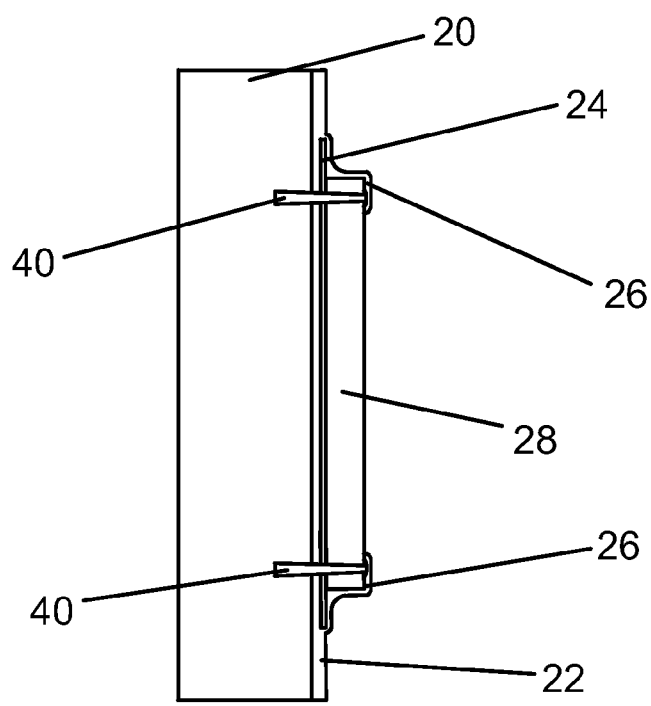
FIG. 6 is a side view of a structurally reinforced photovoltaic module according to another embodiment of the present invention.

FIG. 6 is basically the same as the embodiment shown in FIGS. 4 and 5 with the addition of structural element 24 to provide a better bonding surface as discussed above. Additionally, it is possible to place a sloped insert (FIGS. 6 and 30) under photovoltaic element 28 to better align photovoltaic element 28 with the sun.

Figure 7:
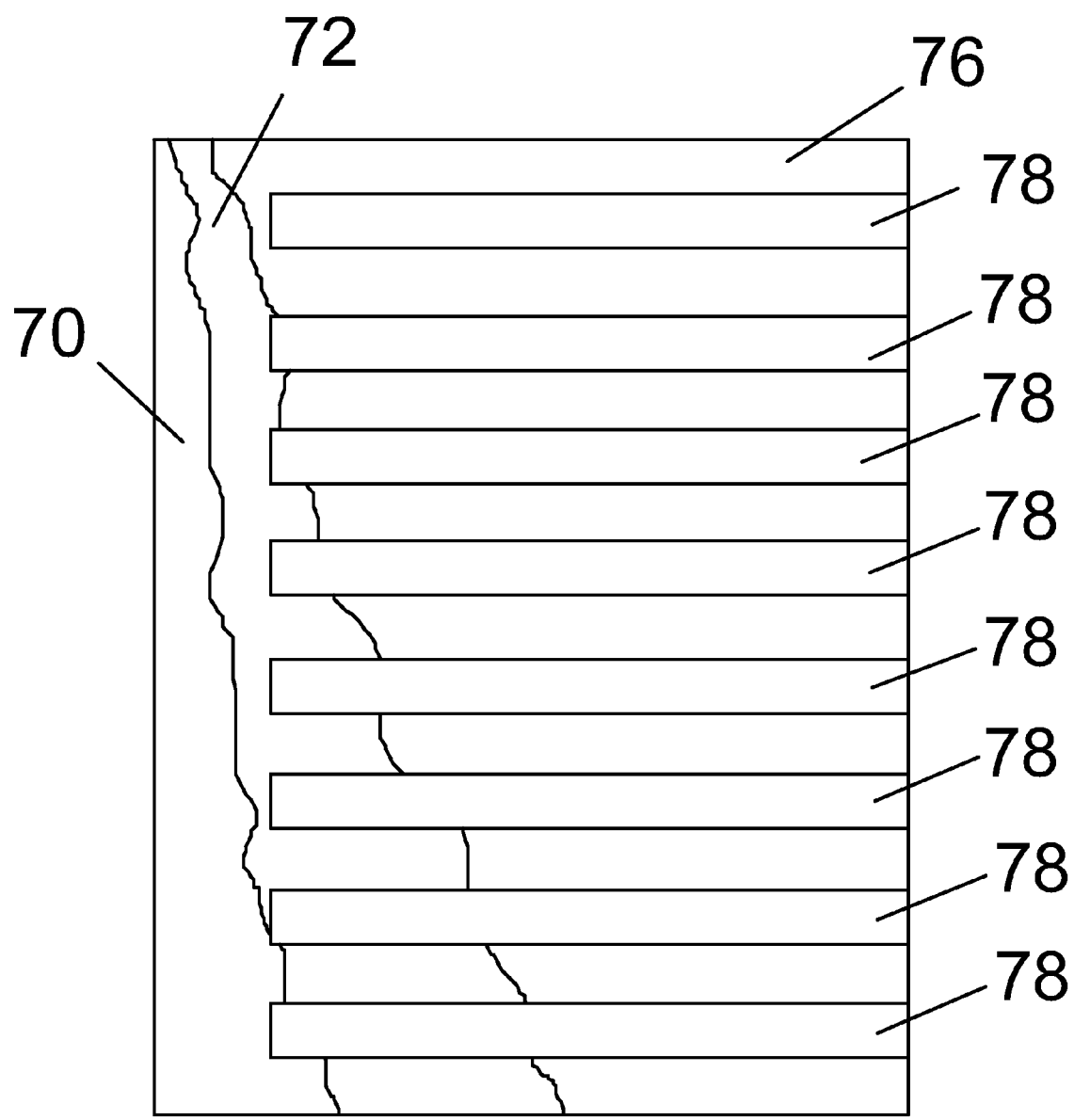
FIG. 7 is a top view of a surface treated according to an embodiment of the present invention.

Referring now to FIG. 7, a surface 70 is shown having a plurality of photovoltaic elements 78. As discussed above, a first elastomeric base coat 72 is applied over the entire surface to be treated, sealing and weatherproofing surface 70. Once surface 70 is coated with elastomeric base coat 72, photovoltaic elements 78 are set in place before elastomeric base coat 72 is dry thus bonding photovoltaic elements 78 to surface 70. Once photovoltaic elements 78 have been placed, another elastomeric coat 76 is applied to the perimeter of each photovoltaic element 78 thus providing a continuous, seamless, waterproof and weatherproof surface capable of generating electricity. Photovoltaic modules 78 are electrically connected by means of a factory or onsite wiring system in either series, parallel or in combination of series/parallel connections to line conditioners, inverters, system controllers, and system monitors to the building's power system for on-the-grid or off-the-grid application as is known in the art.

In another embodiment, first elastomeric base coat 72 is applied over the entire surface to be treated and then allowed to dry. An additional elastomeric coating (not shown) is applied to a lower surface of photovoltaic elements 78 or alternatively to a region corresponding to an area where photovoltaic elements 78 will be placed on surface 70 and then photovoltaic elements 78 are placed thereon with the additional elastomeric coating providing the necessary adhesion to anchor photovoltaic elements 78. Alternatively, photovoltaic elements 78 may be supplied with a self stick adhesive coating (not shown) and a protective backing which is removed during installation. A field applied adhesive (not shown) may be used to apply module to the waterproofed surface 70 prior to sealing photovoltaic module 78 with elastomeric coating 76. In yet another embodiment, photovoltaic element 78 is factory supplied with a structural element (not shown) such as synthetic fabric or mesh to increase the bonding properties therein.

Photovoltaic elements are more efficient when facing the sun. When photovoltaic elements are mounted on a roof, solar efficiency changes during the day due to the Earth's rotation. One solution to this problem is a sloped installation of the photovoltaic elements.

Figure 8:
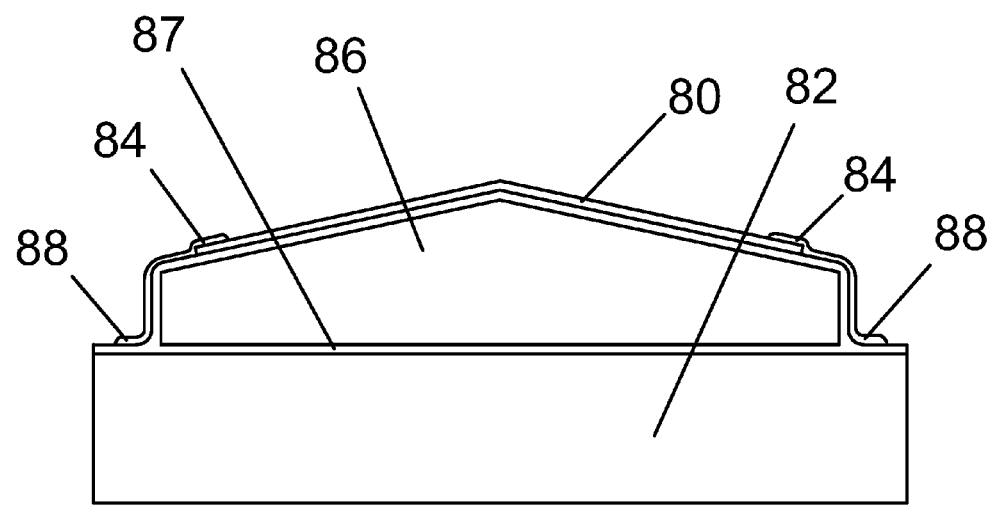
FIG. 8 is a cutaway view of a surface having a dual slope photovoltaic module according to an embodiment of the present invention.
Figure 30:
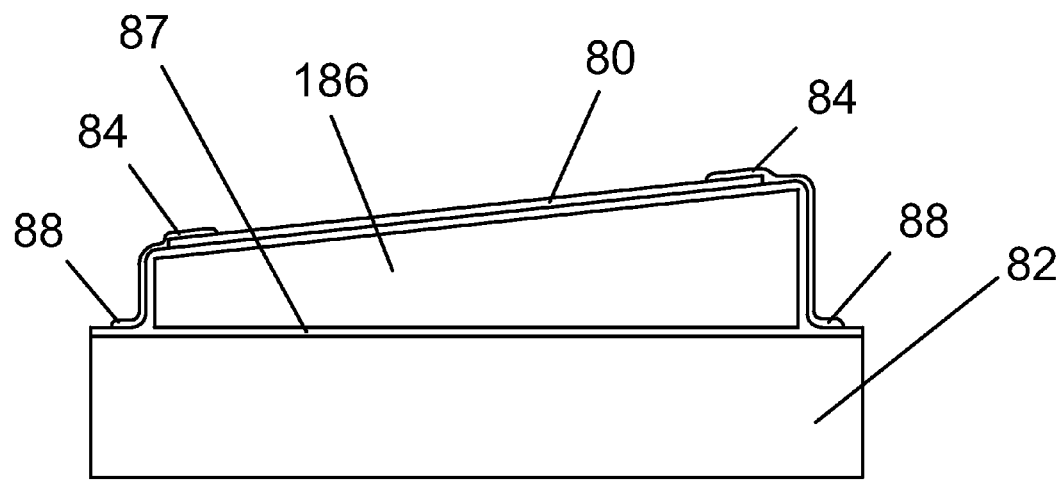
FIG. 30 is a cutaway view of a surface having a single slope photovoltaic module according to an embodiment of the present invention.

FIGS. 8 and 30 are examples of a dual slope installation (FIG. 8) and a single slope installation (FIG. 30) respectively according to an embodiment of the present invention. A surface 82 is prepared by applying an elastomeric base coat 87 over the entire surface to be treated. Next a dual slope insert 86 or a single slope insert 186 is applied to elastomeric base coat 87 and elastomeric base coat 87 is also applied over dual slope insert 86 or single slope insert 186. Next photovoltaic element 80 is applied to both sides of dual slope insert 86 or to one side of single slope insert 186 and another elastomeric coat 86 is applied to the perimeter of photovoltaic element 80 thus sealing and providing a continuous, seamless, waterproof and weatherproof surface. Additionally, photovoltaic element 80 may be supplied with structural elements (not shown) as discussed above. Typical insulative inserts include synthetic fabrics and mesh, polyisocyanurate foam, expanded or extruded polystyrene foam, organic fiber, mineral composite, plastic polymer and fiberglass as well as others as is known in the art.

Figure 9:
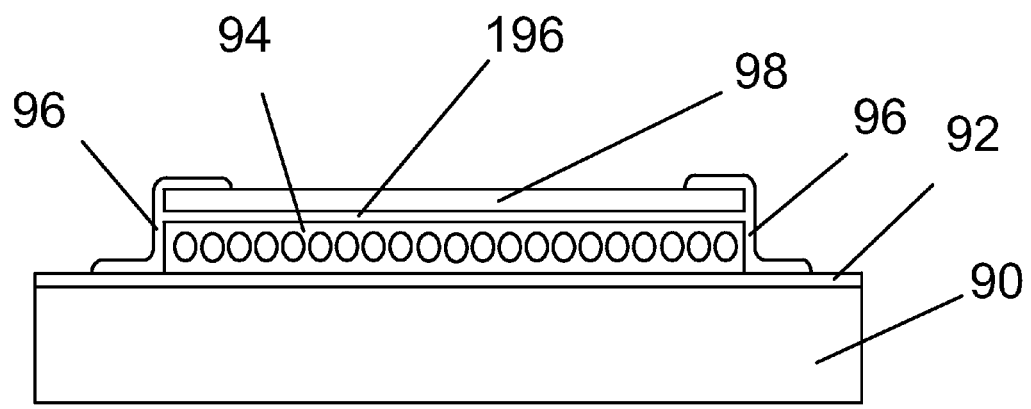
FIG. 9 is a cutaway view of a surface portion having a thermally stabilized photovoltaic module according to an embodiment of the present invention.

Photovoltaic elements are more efficient in a specific temperature range yet most climates vary greatly from season to season and even on a daily basis. In order to increase efficiency, it is sometimes desirable to mount a liquid temperature regulating system to regulate the temperature of the photovoltaic element. FIG. 9 is a cutaway view showing such an installation. Surface 90 is covered as before with elastomeric base coat 92 and a tubing module 94 is placed against elastomeric base coat 92. Tubing module 94 is connected to a pumping system to control the flow and temperature of the liquid within the tubes as is known in the art. Another elastomeric layer 196 is applied over tubing module 94 further sealing surface 90. A photovoltaic element 98 is placed over elastomeric layer 196 covering tubing module 94 thus regulating the temperature thereof. An additional elastomeric coat 96 is applied around the perimeter of photovoltaic element 98 and the sides of tubing module 94 thus providing a continuous, seamless, waterproof and weatherproof surface capable of generating electricity. Additionally, the system can be used in conjunction with solar water heating modules as is known in the art to not only provide thermal regulation but additional energy savings by utilizing the heated water.

Figure 10:
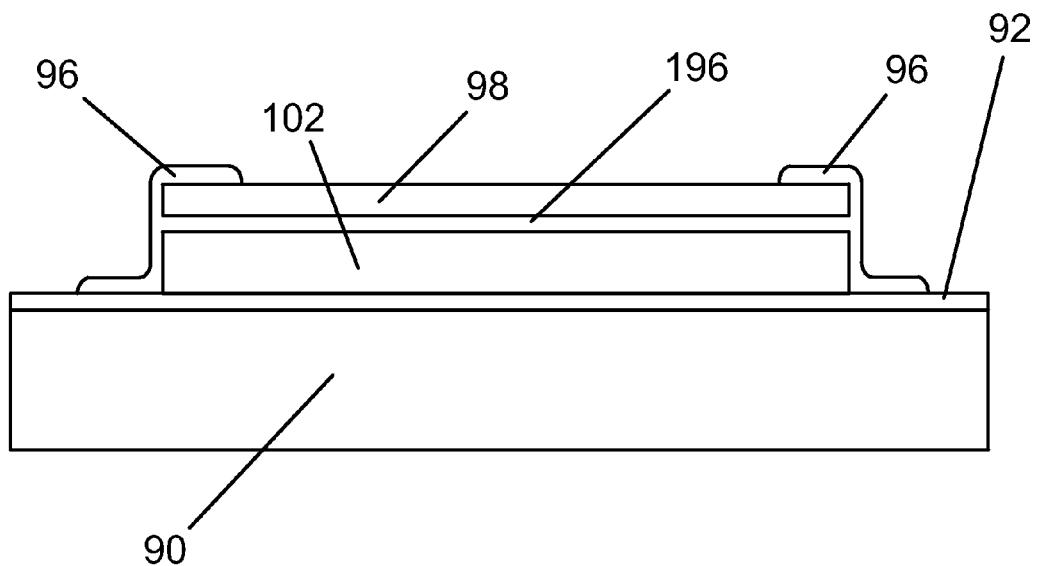
FIG. 10 is a cutaway view of a surface portion having an insulating member integrated in a photovoltaic module according to an embodiment of the present invention.

FIG. 10 illustrates a passive thermal regulating embodiment of the present invention. Surface 90 is coated with elastomeric base coat 92 as discussed above and an insulating insert 102 is applied. Another elastomeric layer 196 is applied over insulting insert 102 further sealing surface 90. Typical insulative inserts include synthetic fabrics and mesh, polyisocyanurate foam, expanded or extruded polystyrene foam, organic fiber, mineral composite, plastic polymer and fiberglass as well as others as is known in the art.

Photovoltaic element 98 is placed on top of elastomeric layer 196 which covers insulating insert 102. Again, another elastomeric coat 96 is applied to the perimeter of photovoltaic element 98 and the sides of insulating insert 102 to provide a continuous, seamless, waterproof and weatherproof surface capable of generating electricity.

Figure 11:
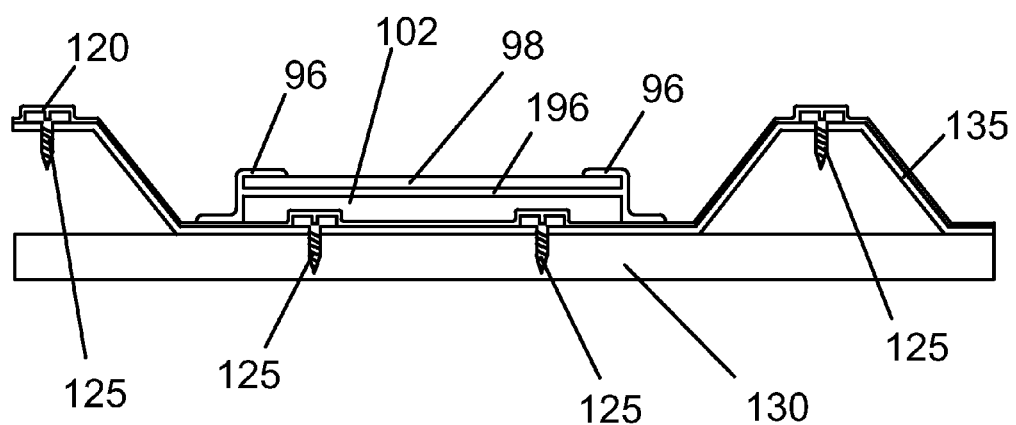
FIG. 11 is a cutaway view of a corrugated surface treated according to an embodiment of the present invention.

FIG. 11 shows the present invention as applied to a corrugated surface 135 covering a substrate 130. An elastomeric base coat 120 is applied over corrugated surface 135 to be treated. It should be noted that elastomeric base coat 120 completely encapsulates seam fasteners 125 thus eliminating a possible source of environmental exposure. Insulated insert 102 is placed on corrugated surface 135 between the corrugations. Insulated insert 102 is deformed to provide a level surface to mount photovoltaic element 98 as is known in the art. Insulating insert 102 is bonded and sealed by means of another elastomeric coat 196. Photovoltaic element 98 is placed on top of insulating insert 102 and another elastomeric coat 96 is applied around the perimeter of photovoltaic element 98 thus providing a continuous, seamless, waterproof and weatherproof surface while also providing electricity. This is particularly advantageous since corrugated surfaces often leak as they age. As discussed above, a structural element (not shown) may be used to provide further stability and enhance weatherproofing properties therein.

Figure 12:
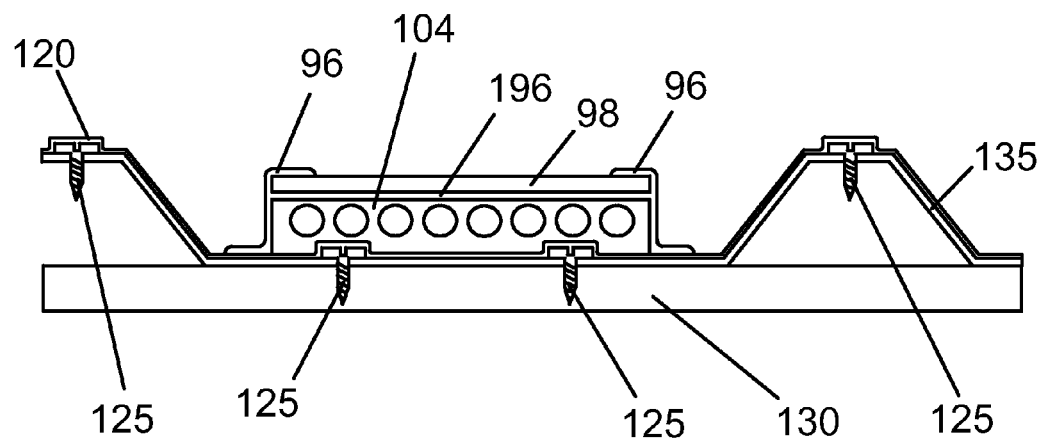
FIG. 12 is a cutaway view of a corrugated surface having a thermally stabilized photovoltaic module according to an embodiment of the present invention.
Figure 13:
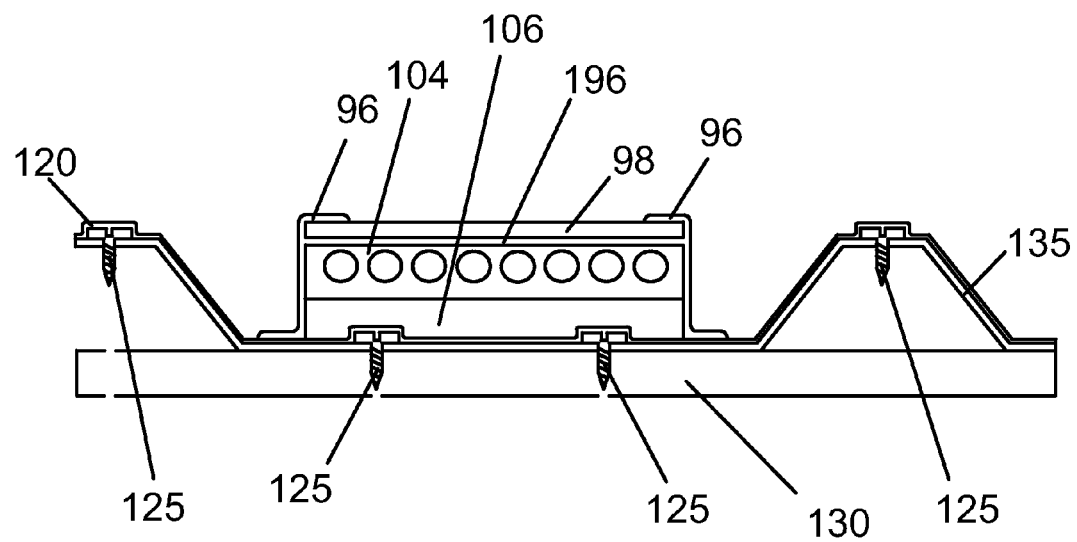
FIG. 13 is a cutaway view of a corrugated surface having a thermally stabilized photovoltaic module according to another embodiment of the present invention.

FIGS. 12 and 13 illustrate other embodiments of the present invention as practiced on corrugated surfaces. The embodiment shown in FIG. 12 utilizes a tubing module 104 mounted beneath photovoltaic element 98 with another elastomeric layer 196. As discussed above, tubing module 104 is connected to a pumping system (not shown) as is known in the art. This regulates the temperature of photovoltaic element 98 increasing efficiency. The embodiment illustrated in FIG. 13 also includes an insulated insert 106 to further control temperature of photovoltaic element 98 as described previously.

Figure 31:
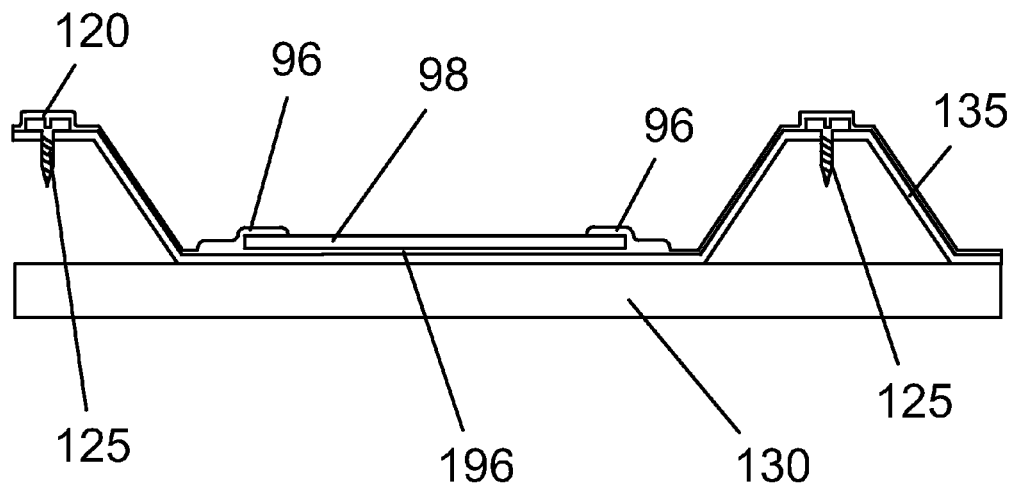
FIG. 31 is a cutaway view of a corrugated surface having a thermally stabilized photovoltaic module according to another embodiment of the present invention.

Referring to FIG. 31, an embodiment of the present invention applied to a corrugated surface is shown having a flat profile between the corrugations and is coated with elastomeric base coat 120 over the surface to be treated. Again, as discussed above, seam fasteners 125 are covered by elastomeric base coat 120 to provide a continuous, seamless, waterproof and weatherproof surface. Photovoltaic element 98 may be placed on elastomeric base coat 120 while it is still wet or elastomeric base coat 120 may be allowed to dry and then another elastomeric coat 196 may be applied to either an area where photovoltaic element 98 will be placed or applied directly to photovoltaic element 98 to bond photovoltaic element 98 to the surface. Photovoltaic element 98 is placed on top of insulating insert 102 and another elastomeric coat 96 is applied around the perimeter of photovoltaic element 98 thus providing a continuous, seamless, waterproof and weatherproof surface while also providing electricity.

Figure 14:
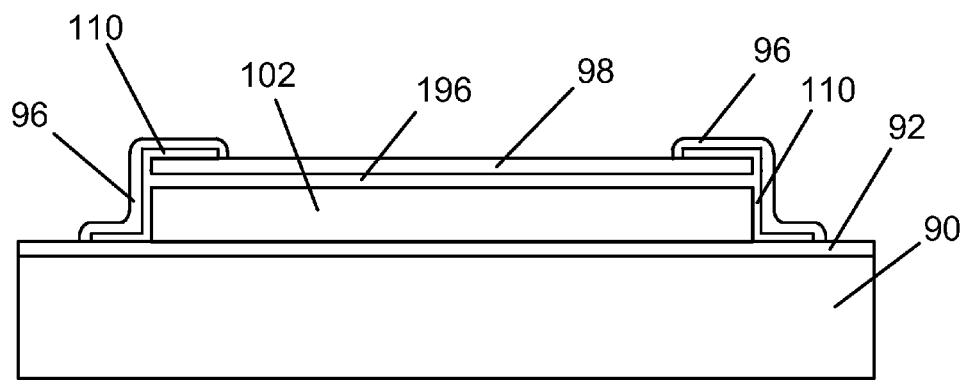
FIG. 14 is a cutaway view of a surface treated according to an embodiment of the present invention.
Figure 15:
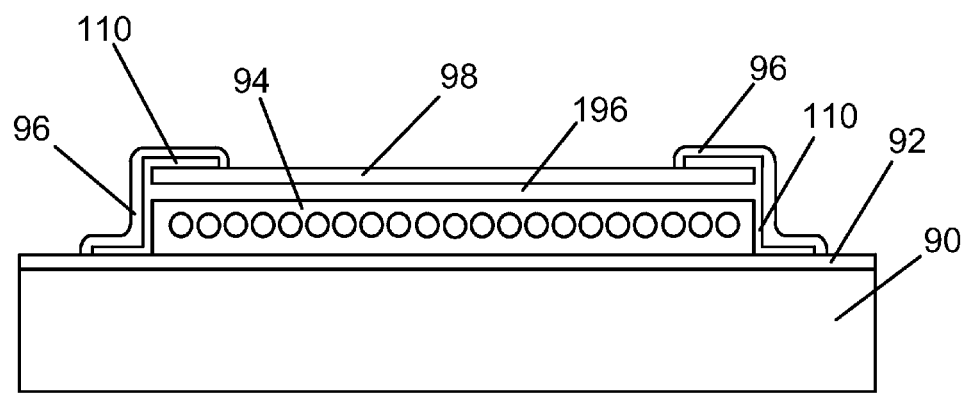
FIG. 15 is a cutaway view of a surface having a thermally stabilized photovoltaic module according to an embodiment of the present invention.
Figure 16:
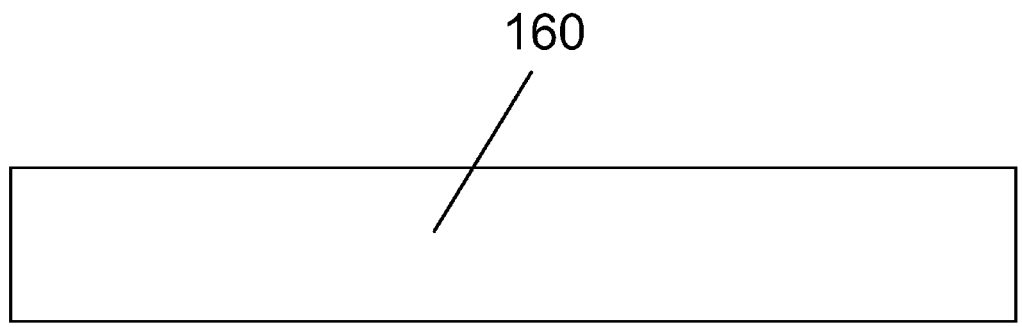
FIG. 16 is a cutaway view that illustrates a step according to an embodiment of the present invention.
Figure 17:
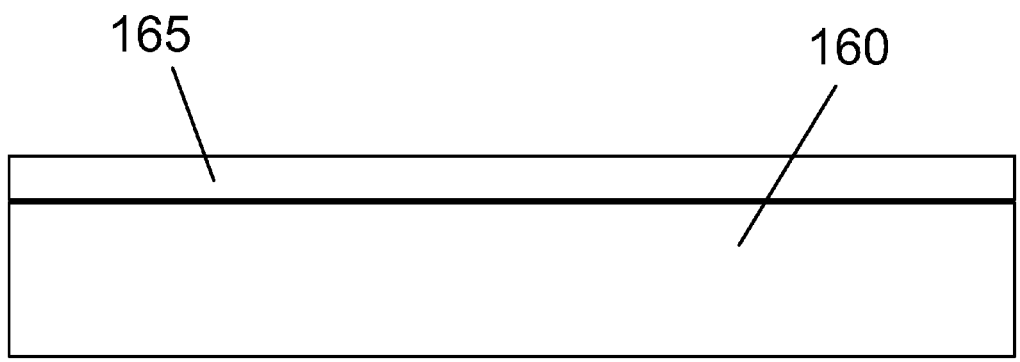
FIG. 17 is a cutaway view that illustrates a second step according to an embodiment of the present invention.
Figure 18:
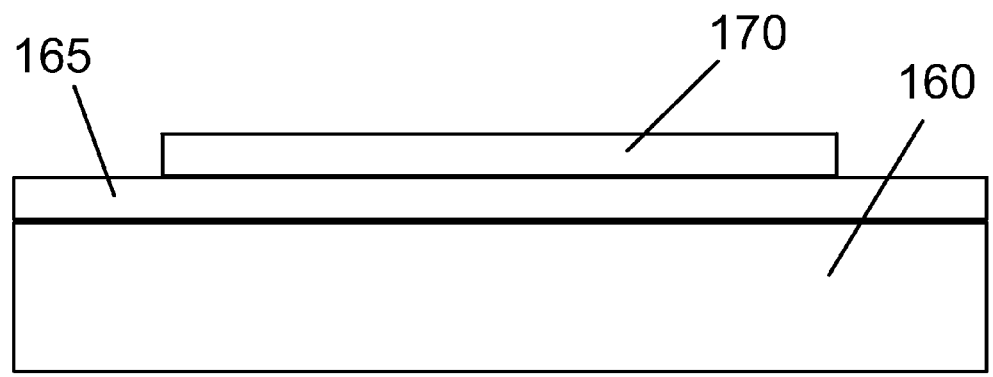
FIG. 18 is a cutaway view that illustrates a third step according to an embodiment of the present invention.

FIGS. 14 and 15 illustrate embodiments that utilize a flashing element 110 to provide even more protection against water and water vapor intrusion. Flashing element 110 may be field applied by technicians or may be factory applied to photovoltaic element 98. If field applied, elastomeric base coat 92 may be utilized to bond flashing element 110 to photovoltaic element 98 as well as to surface 90. Flashing elements 110 and 96 can be reinforced with an embedded synthetic fabric or mesh. Alternatively, any suitable adhesive may be utilized to bond flashing element to elastomeric base coat 92. Again another elastomeric coat 96 is applied around the perimeter of photovoltaic element 98 covering flashing element 110 providing a continuous, seamless, waterproof, weatherproof surface capable of generating electricity.

FIGS. 16 through 21 illustrate an embodiment of a method according to the present invention providing a continuous, seamless, waterproof, weatherproof surface capable of generating electricity. A surface 160 is prepared to receive an elastomeric base coat 165. If the present invention is practiced on an existing surface, it may be desirable to prepare the surface by power washing or otherwise cleaning debris and other environmental buildup. Elastomeric base coat 165 will cover cracks, holes and other imperfections in surface 160. Additionally, due to the properties of elastomeric base coat 165, the surface will gain structural integrity and become impervious to weather related hazards such as hail, snow, rain and moisture and general weathering. In one embodiment, a photovoltaic element 170 is placed against elastomeric base coat 165 while it is still wet to anchor photovoltaic element 170 thereon. In another embodiment, elastomeric base coat 165 is allowed to dry and then another elastomeric coat (not shown) is applied either to an area corresponding to the position where photovoltaic element 170 will be placed or alternatively on a lower surface of photovoltaic element 170. In some applications it may be desirable to utilize an adhesive backed photovoltaic element or a field applied adhesive (not shown) to provide further anchoring to photovoltaic element 170 as is known in the art.

Figure 19:
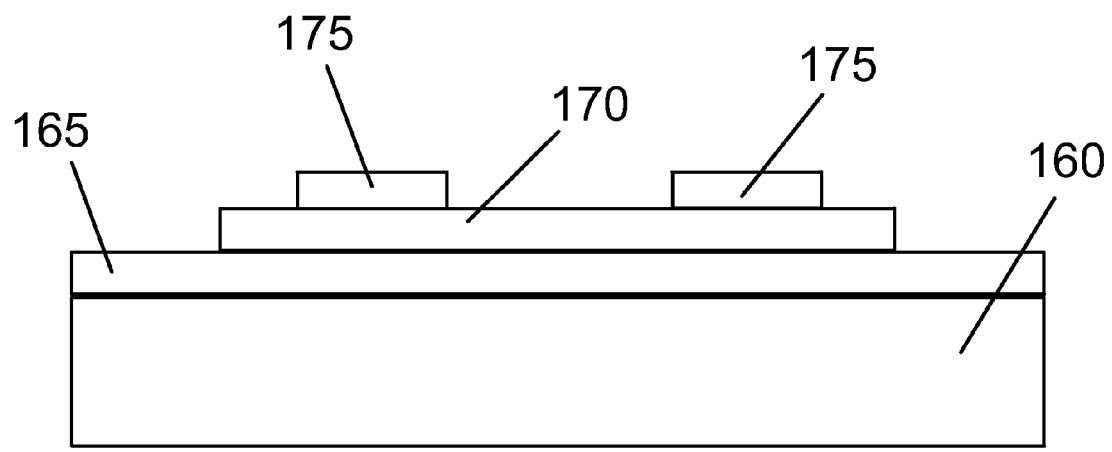
FIG. 19 is a cutaway view that illustrates a fourth step according to an embodiment of the present invention.
Figure 20:
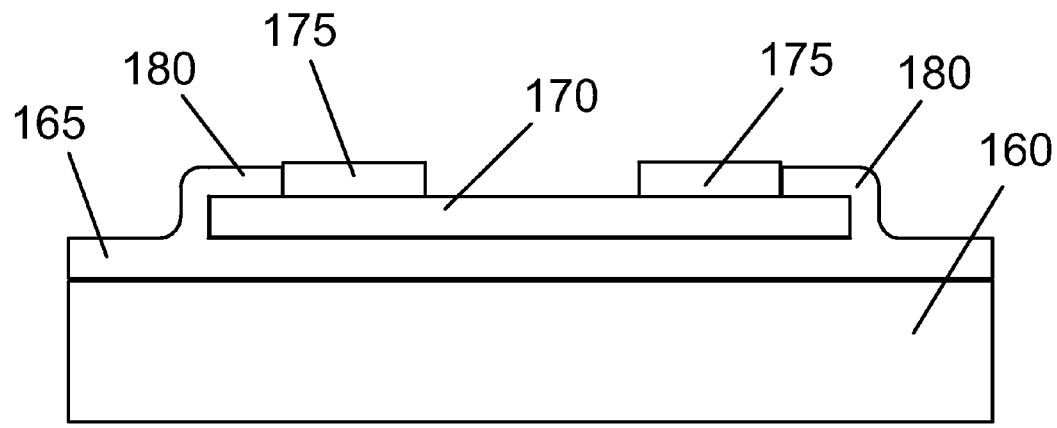
FIG. 20 is a cutaway view that illustrates a fifth step according to an embodiment of the present invention.
Figure 21:
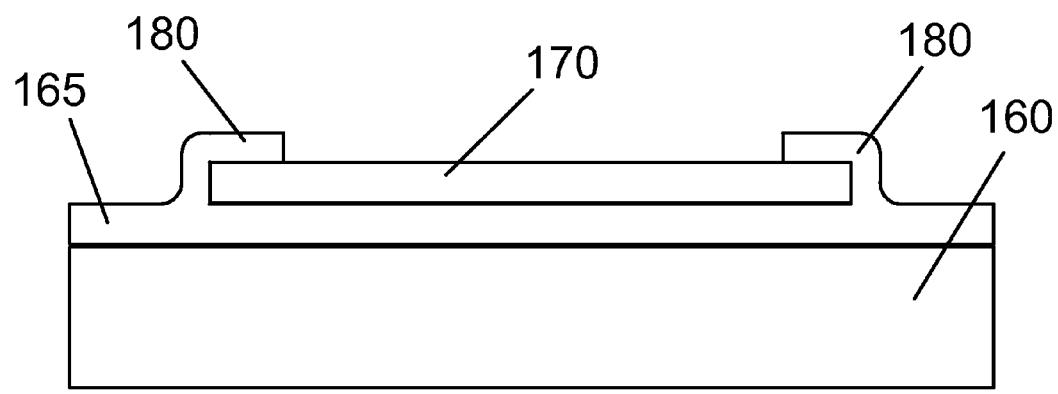
FIG. 21 is a cutaway view that illustrates the finished product according to an embodiment of the present invention.

In the embodiment shown in FIG. 19, a mask 175 may be field applied or may be provided by the manufacturer of photovoltaic element 170. Mask 175 may be masking tape or other masking material and is used to protect the surface of photovoltaic element 170 while applying another elastomeric coat 180. Another elastomeric coat 180 is applied to elastomeric base coat 165 and around the perimeter of photovoltaic element 170 being careful not to extend past mask 175. Once elastomeric coat 180 is dry, mask 175 is removed completing the installation and providing a continuous, seamless, waterproof and weatherproof surface capable of generating electricity. Elastomeric base coat 165 and another elastomeric coat 180 need not be the same material. For example, elastomeric base coat 165 may be optimized to provide excellent sealing and crack coverage while not providing sufficient UV protection. In such an application, another elastomeric coat 180 may be optimized to provide superior UV protection thus sealing the vulnerable elastomeric base coat 165 underneath.

Figure 22:
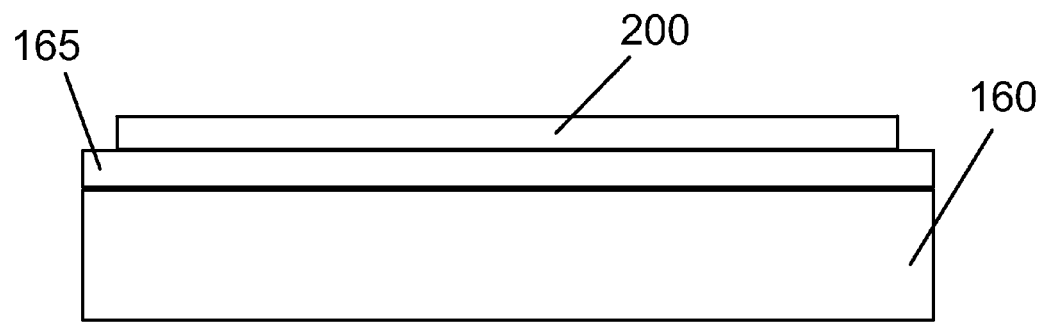
FIG. 22 is a cutaway view of yet another step according to an embodiment of the present invention.
Figure 23:
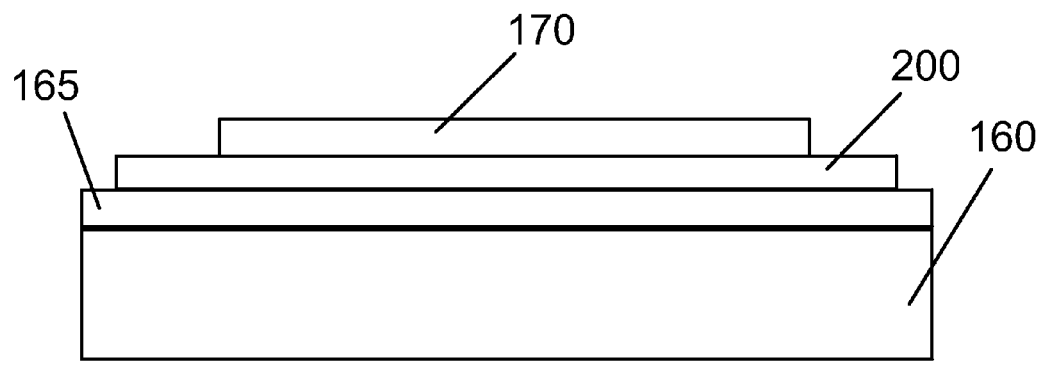
FIG. 23 is a cutaway view of yet another step according to an embodiment of the present invention.
Figure 24:
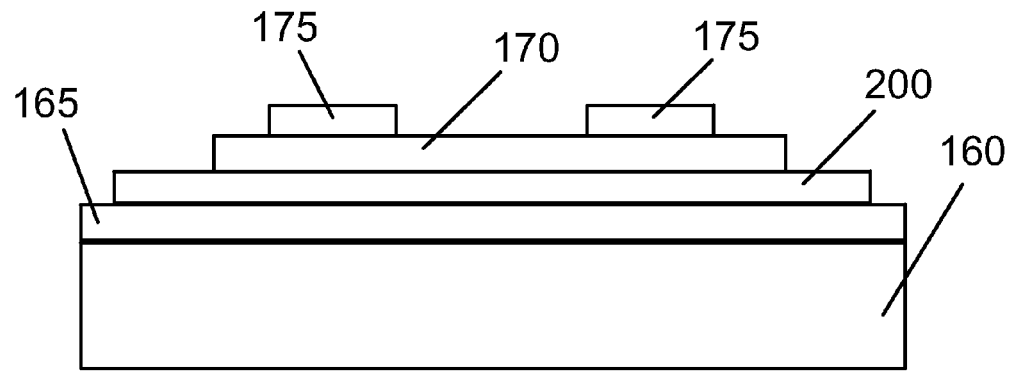
FIG. 24 is a cutaway view of another step according to an embodiment of the present invention.
Figure 25:
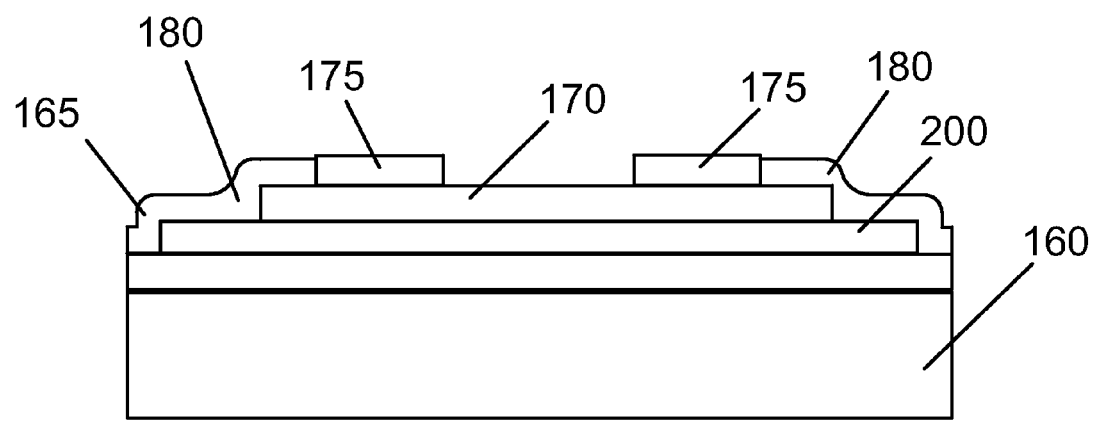
FIG. 25 is a cutaway view of a step according to an embodiment of the present invention.
Figure 26:
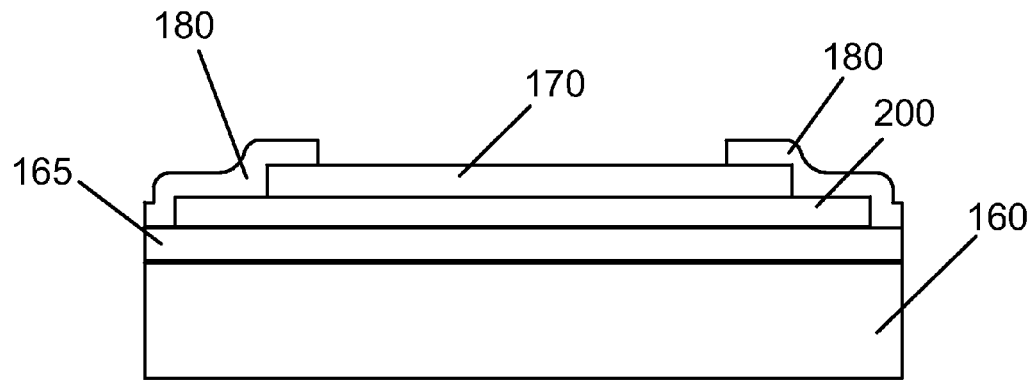
FIG. 26 is a cutaway view of still another step according to an embodiment of the present invention.

FIG. 22 illustrates an embodiment that includes adding structural element 200 to the process discussed above. Structural element 200 may be a non-reinforced or reinforced polymer structure, polyester mesh or other synthetic fabric designed to increase the stability, mechanical properties and holding power of elastomeric materials. FIG. 23 shows photovoltaic element 170 placed on top of structural element 200. FIG. 24 shows mask 175 being applied to photovoltaic element 170. Next, FIG. 25 shows another elastomeric coat 180 being applied on top of structural element 200 and photovoltaic element 170, thereby sealing structural element 200 and photovoltaic element 170 within. Mask 175 protects photovoltaic element 170 during installation. FIG. 26 shows the completed surface with mask 175 removed thus providing a continuous, seamless, waterproof, weatherproof surface capable of generating electricity.

Figure 27:
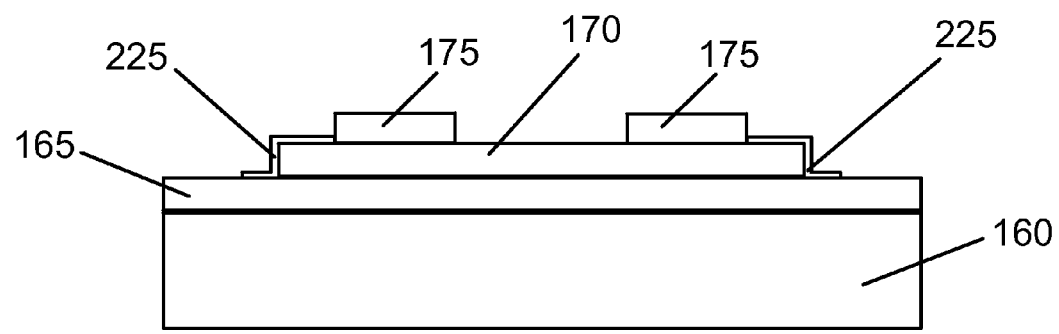
FIG. 27 is a cutaway view of a step according an embodiment of the present invention.
Figure 28:
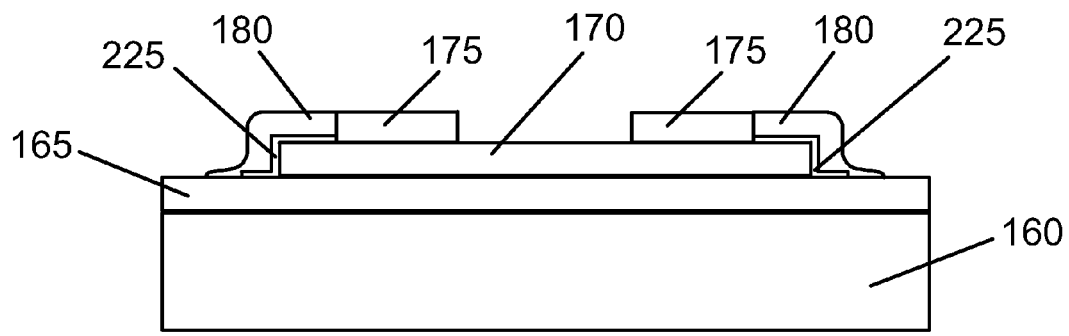
FIG. 28 is a cutaway view of a step according to an embodiment of the present invention.
Figure 29:
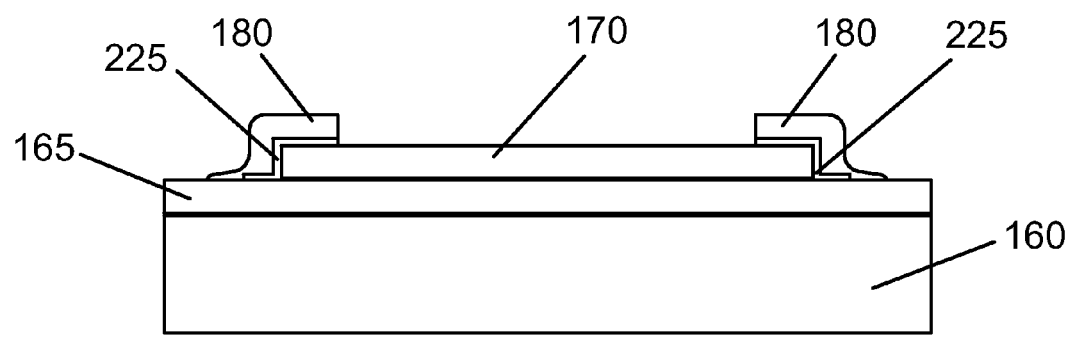
FIG. 29 is a cutaway view of a step according to an embodiment of the present invention.

FIG. 27 illustrates an embodiment with an additional flashing element 225 either field installed or factory installed on photovoltaic element 170. Mask 175 is either field applied or factory applied. In FIG. 28 another elastomeric coat 180 is applied on top of elastomeric reinforced flashing element 225 and photovoltaic element 170 thus sealing and protecting photovoltaic element 170. In FIG. 29, mask 175 has been removed completing the installation to provide a continuous, seamless, waterproof, weatherproof surface capable of generating electricity.

Figure 32:
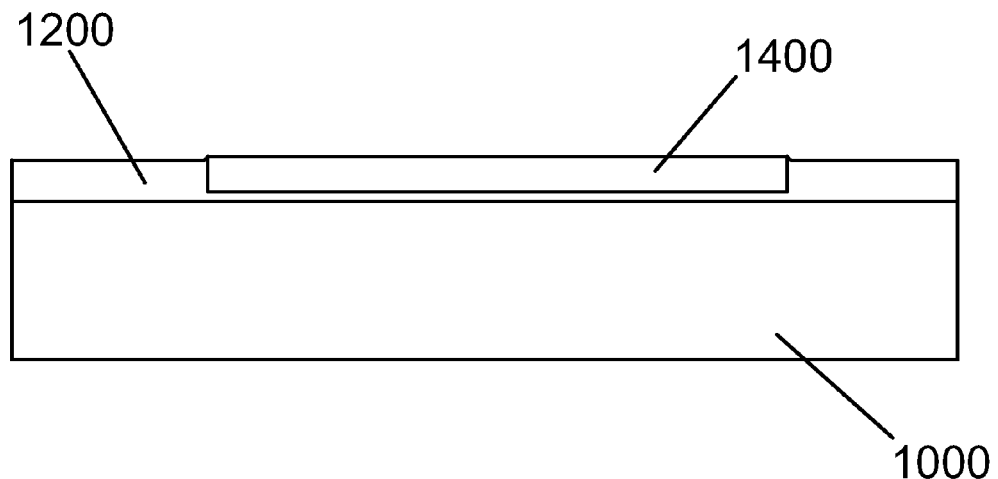
FIG. 32 is a cutaway view of an embodiment according to the present invention.

Referring to FIG. 32, a structure 1000 is coated with an elastomeric coat 1200 and a photovoltaic element 1400 is placed against elastomeric coat 1200 to secure it therein. Elastomeric coat 1200 in conjunction with photovoltaic element 1400 provide a continuous, seamless, waterproof and weatherproof covering the part of structure 1000 covered therein.

Figure 33:
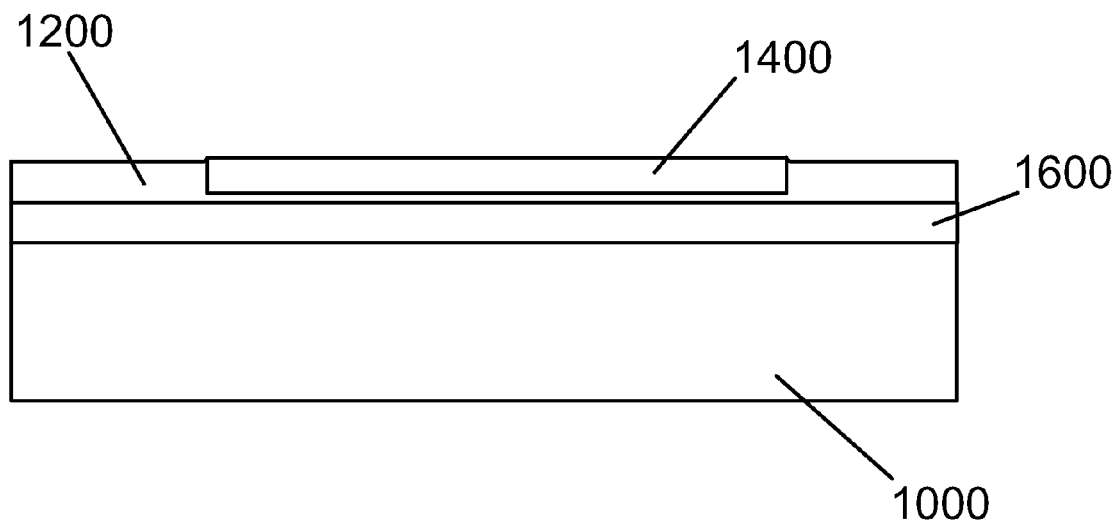
FIG. 33 is a cutaway view of another embodiment according to the present invention.

Referring now to FIG. 33, an alternative embodiment is illustrated as having structure 1000 coated with a first elastomeric coat 1600. Next, elastomeric coat 1200 is applied on top of first elastomeric coat 1600 and photovoltaic element 1400 is placed against elastomeric coat 1200. Elastomeric coat 1200 and first elastomeric coat 1600 may be the same material or they may be selected to be a different elastomeric coating as discussed previously.

Figure 34:
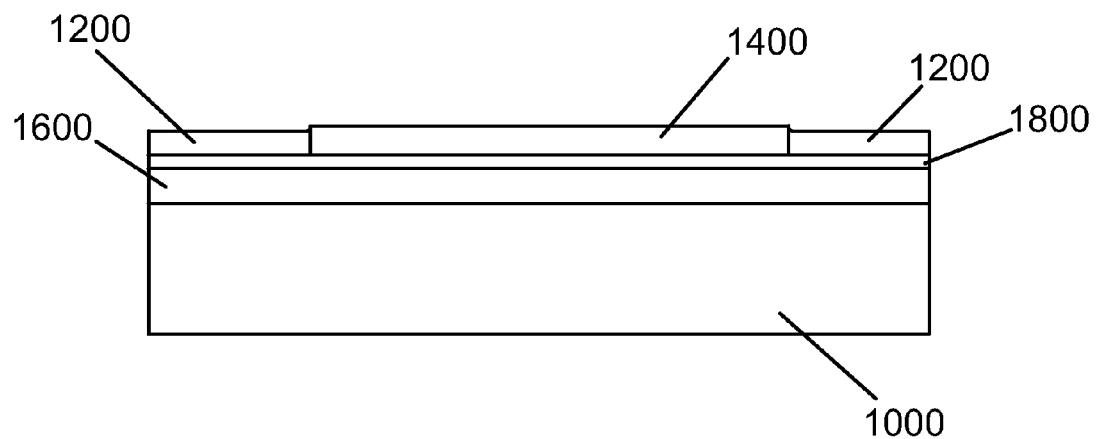
FIG. 34 is a cutaway view of yet another embodiment according to the present invention.

Now referring to FIG. 34, in another embodiment according to the present invention, structure 1000 is coated with first elastomeric coat 1600 and then another elastomeric coat 1800 is applied at least under photovoltaic element 1400 and then either while still wet or after drying, photovoltaic element 1400 is placed on elastomeric coat 1800 and elastomeric coat 1200 is applied around the perimeter of photovoltaic element 1400 to provide a continuous, seamless, waterproof and weatherproof covering over the part of structure 1000 that is covered therein. Again as discussed above, elastomeric coats 1600, 1800 and 1200 may all be the same material or a combination of elastomeric materials selected to have specific properties such as heat resistance, low vapor permeance, U.V. resistance or weathering properties, etc.

Figure 35:
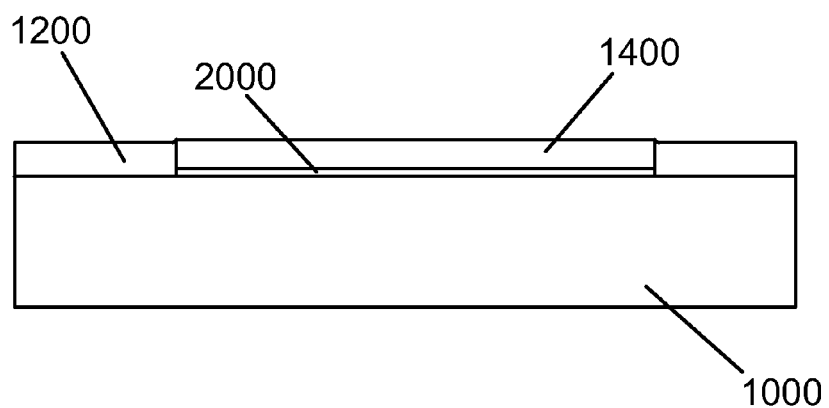
FIG. 35 is a cutaway view of still another embodiment according to the present invention.

Reference is now made to FIG. 35 which shows structure 1000 having photovoltaic element 1400 applied directly therein using another layer 2000 which may be an adhesive material such as a self-adhesive applied to a lower surface of photovoltaic element 1400, a double-sided self release tape that is applied either from the factory or in the field during installation, a construction adhesive applied on site during installation or even another elastomeric layer. The double-sided release tape may be a reinforced fabric with an adhesive on both sides with each side having a removable release film. Of course other kinds of adhesive materials would be acceptable as is known in the art. Elastomeric coat 1200 is then applied around the perimeter of photovoltaic element 1400 as discussed above.

Figure 36:
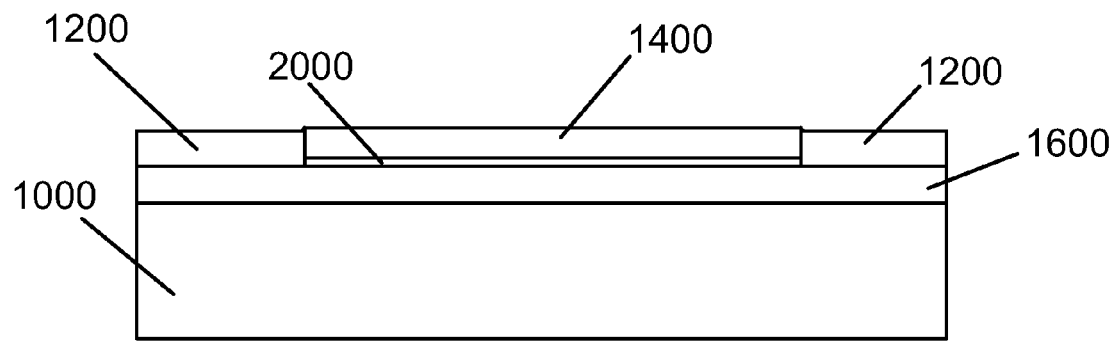
FIG. 36 is a cutaway view of another embodiment according to the present invention.

Reference is now made to FIG. 36 which shows structure 1000 having photovoltaic element 1400 applied on top of elastomeric coat 1600. Photovoltaic element 1400 is adhered to elastomeric coat 1600 with another layer 2000 such as a self-adhesive applied to a lower surface of photovoltaic element 1400, a double-sided self release tape that is applied either from the factory or in the field during installation, construction adhesive applied on site during installation or another elastomeric layer as discussed above. Elastomeric coat 1200 is then applied around the perimeter of photovoltaic element 1400 as discussed above.

Figure 37:
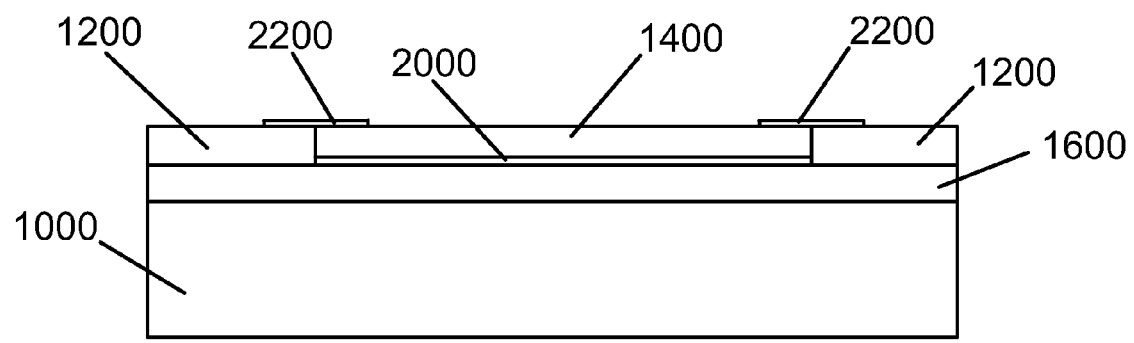
FIG. 37 is a cutaway view of another embodiment according to the present invention.

FIG. 37 illustrates the present invention as applied to structure 1000. Elastomeric coat 1600 is applied and then another layer 2000 is applied under photovoltaic element 1400 and elastomeric coat 1200 is applied around the perimeter as discussed above. A flashing 2200 is applied to the seam between photovoltaic element 1400 and elastomeric coat 1200 to provide extra protection. Flashing 2200 may be a fabric surfaced and fabric reinforced tape with either a polymer or metal film surface and may have a self-adhesive surface. Flashing 2200 may be modified to ensure adhesion when applied to surfaces that are difficult to coat such as Teflon or other such materials.

Figure 38:
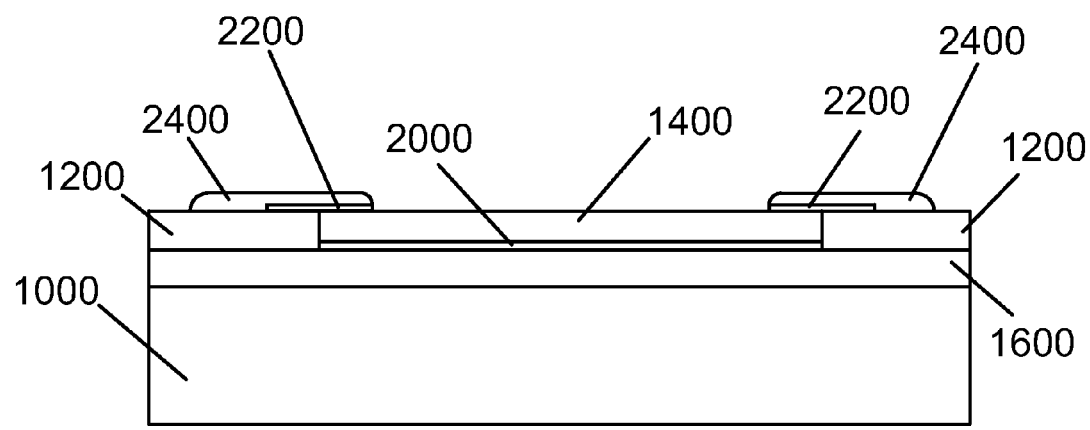
FIG. 38 is a cutaway view of another embodiment according to the present invention.

FIG. 38 is identical to the embodiment shown in FIG. 37 with the addition of another elastomeric coat 2400 over flashing 2200 to further seal the seam from the elements.

Figure 39:
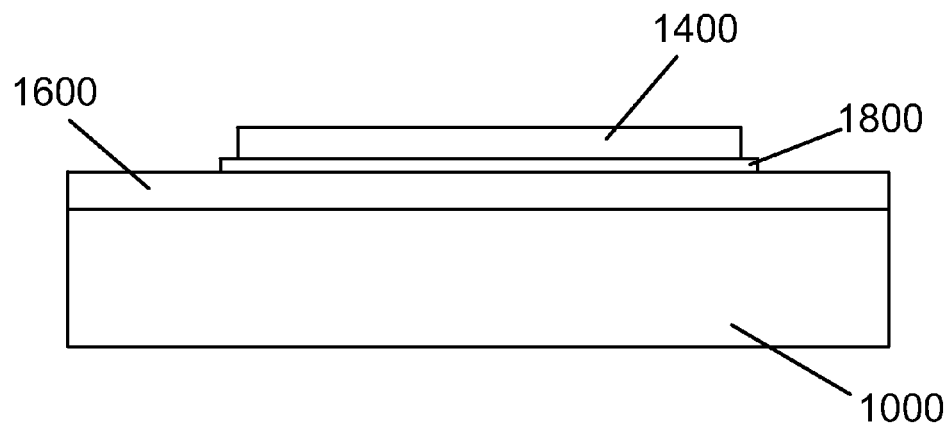
FIG. 39 is a cutaway view of another embodiment according to the present invention.

FIG. 39 illustrates another embodiment according to the present invention where elastomeric coat 1600 is applied over structure 1000 and then another elastomeric coat 1800 is applied under photovoltaic element 1400 to provide a continuous, seamless, waterproof and weatherproof covering over the part of structure 1000 that is covered therein. Again as discussed above, elastomeric coats 1600 and 1800 may be the same or different materials.

Figure 40:
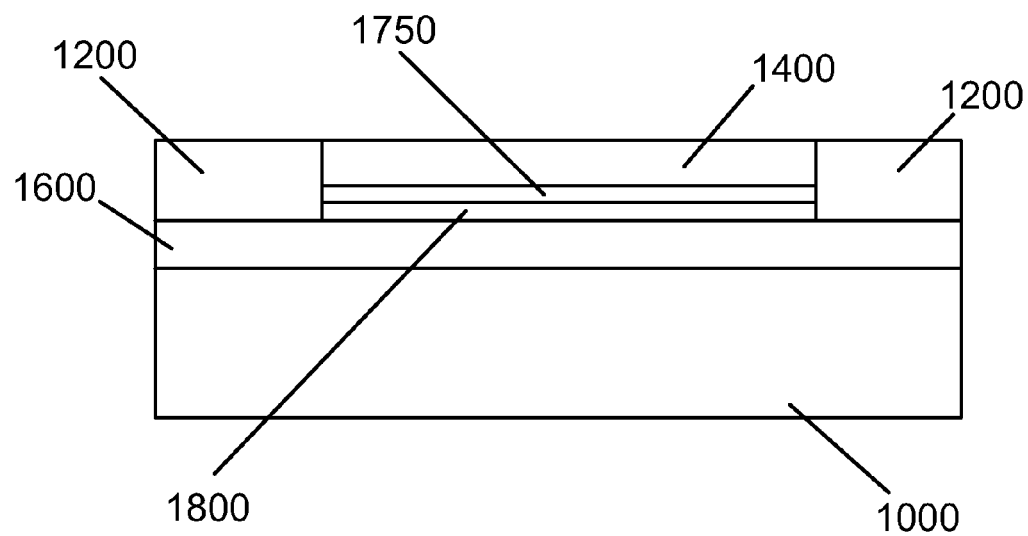
FIG. 40 is a cutaway view of another embodiment according to the present invention.

Now referring to FIG. 40, structure 1000 is coated with elastomeric coat 1600 and then another elastomeric coat 1800 is applied at least under an area under photovoltaic element 1400. An inter-ply element 1750 is applied. Inter-ply element 1750 may be a fabric mesh, a polymer, metal foil or combination therein. Inter-ply element 1750 functions as reinforcement, insulator and/or vapor barrier. In some applications, it may be advantageous to include even more inter-ply layers with each layer providing a specific function such as a separate vapor layer and then a reinforcement layer.

Figure 41:
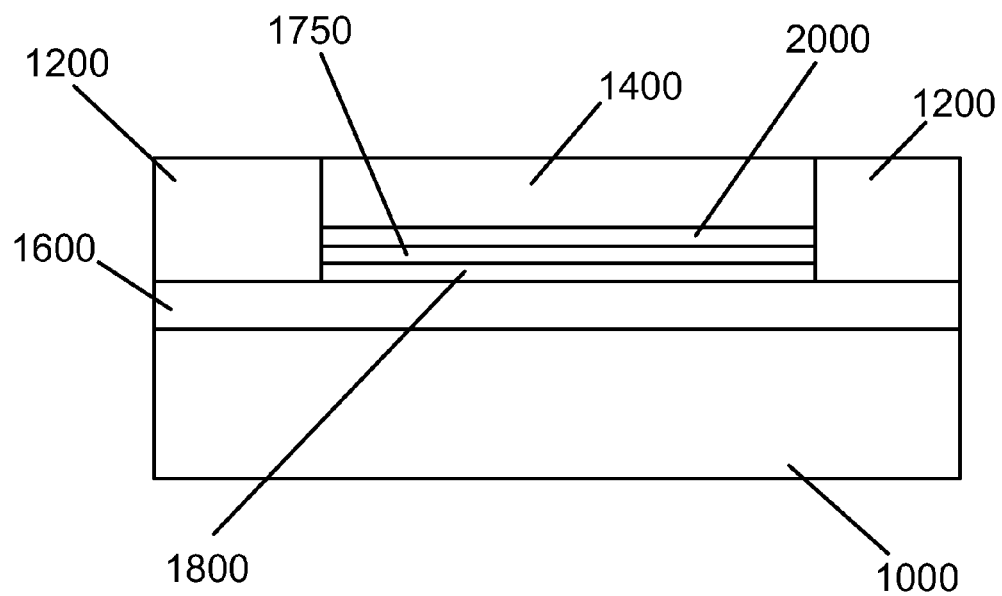
FIG. 41 is a cutaway view of another embodiment according to the present invention.

Referring now to FIG. 41, structure 1000 is shown having a plurality of layers as discussed above. In addition to another elastomeric layer 1800 and inter-ply layer 1750, another layer 2000 is added to secure photovoltaic element 1400 and to create a coating compatible surface. As discussed above, more layers (not shown) may be added to meet specific applications.

Different combinations of inter-ply, structural elements, flashing members, vapor retarders, mechanical support structures may be utilized to provide the desired result and are considered to be within the scope of the present invention. Elastomeric coatings may include but not limited to the following:

Acrylic coatings: these coatings are typically white in color but can be tinted any color and may be latex or acrylic resin polymer based. If used with concrete it is desirable to utilize a concrete primer.

Polyurethane or urethane coatings: one component moisture, water cured urethane polymers as well as two component catalysis cured urethanes may be applied in one or two or more coat applications (i.e. base and finish coat) and are available in a wide range of colors. Urethane coatings have high tensile strength, are resistant to pooling water and many chemicals and once cured form a strong long-lasting waterproof and weatherproof surface that has superior long-term weathering characteristics.

Asphalt-based coatings: asphalt-based waterproof coatings are found either as a solvent based or water-based emulsion type coating. Asphalt-based waterproof coatings are sometimes modified with different polymers and modifiers such as neoprene rubber to improve their long-term performance and adhesion to concrete or asphalt-based substrates. Asphalt-based coatings may require a primer due to asphalt's black color and may need an additional white acrylic or urethane coating.

Polyurea coatings: polyurea-based concrete waterproof coatings are made of two components; an isocyanate compound in a resin blend with only amine-terminated components. Such coatings require special equipment to mix and spray. Polyurea and polyurethane hybrid blends have a slower setting time and provide superior wetting of the concrete substrate. Other waterproofing coatings may be used and should be selected based on the surface being protected as is known in the art. The coatings may have additional surface treatments such as mineral or ceramic granules applied to protect the top coating surface or to improve fire code ratings.

Solar electric or photovoltaic (PV) panels. There are basically two categories of photovoltaic technologies commonly used to manufacture commercial PV modules. The first technology utilizes relatively thick crystals and includes solar cells made from crystalline silicon either as a single or polycrystalline wafer and can be integrated on rigid, semi-flexible or flexible panels. A second technology utilizes thin-film products that typically incorporate very thin layers of photovoltaic active material placed on glass, metal foil or plastic substrate. Thin-film modules are made by depositing photoelectric materials on stainless steel or polymer-based substrates and encapsulating the foil in rigid or flexible plastic polymers. The upper polymer cover surface is solar transparent. In general thin-film modules are more flexible than crystalline modules. The semi conductor materials used in the thin-film modules include, but not limited to, amorphous silicon (a-Si), copper indium diselenide (CIS), and cadmium telluride (CdTe). Newer photovoltaic technologies appearing on the market today use dye-sensitized solar cells which contain a dye impregnated layer of titanium dioxide to generate a voltage rather than the semiconducting materials used in most solar cells. Another developing technology is based on nanotechnology photovoltaics. A photovoltaic system is constructed by assembling a number of individual collectors called modules which are electrically and mechanically connected in an array.

Photovoltaic elements produce electricity by exposure to sunlight and need to be wired according to manufacturer specifications. All photovoltaic elements utilized by the present invention are commercially available units or modules manufactured to specifically incorporate the design elements described and are wired according to the manufacturer specifications. The number of photovoltaic elements utilized will depend upon such factors as available space and power requirements as is known in the art In the thermally regulated embodiments according to the present invention, the apparatus required to circulate the liquid within the tubes may be remotely located or adjacent to the installation as is known in the art. Any exposed connections should be sealed by the top elastomeric coat or other waterproofing and weatherproofing methods as is known in the art.

Although the instant invention has been described in relation to particular embodiments thereof, many other variations and modifications and other uses will become apparent to those skilled in the art.

What is claimed is:

1. A method of protecting a roof using elastomeric weatherproofing building material coatings and photovoltaic modules to provide a continuous, seamless, waterproof, weatherproof and electrically generating surface comprising the steps of:

selecting a roof to be treated;

coating said roof surface with a first elastomeric coating wherein said roof is protected from environmental damage;

embedding at least one photovoltaic module within said first elastomeric coating wherein said photovoltaic module is sealed therein;

applying a second elastomeric coating over said first elastomeric coating further sealing said roof and said at least one photovoltaic module therein.

2. The method of layering a structure protecting a roof using elastomeric weatherproofing building material coatings and photovoltaic modules to provide a continuous, seamless, waterproof, weatherproof and electrically generating surface according to claim 1 wherein said first and second elastomeric coats coatings are individually selected to match a specific application.

3. The method of layering a structure protecting a roof using elastomeric weatherproofing building material coatings and photovoltaic modules to provide a continuous, seamless, waterproof, weatherproof and electrically generating surface according to claim 1 wherein said first and second elastomeric coats coatings are selected to be the same material.

4. A method of layering a roof using elastomeric weatherproofing building material coatings and photovoltaic modules to provide a continuous, seamless, waterproof, weatherproof and electrically generating surface comprising the steps of:
- selecting a roof surface to be treated;
- coating said selected roof surface with a first elastomeric coating;
- positioning at least one photovoltaic module on said first elastomeric coating; and
- applying a second elastomeric coat coating over said first elastomeric coat coating and around a perimeter of said photovoltaic module wherein said photovoltaic module is sealed therein wherein said roof surface is sealed from environmental hazards.

5. The method of layering a roof using elastomeric weatherproofing building material coatings and photovoltaic modules to provide a continuous, seamless, waterproof, weatherproof and electrically generating surface according to claim 4 further comprising the step of adhering said at least one photovoltaic module with an adhesive.

6. The method of layering a roof using elastomeric weatherproofing building material coatings and photovoltaic modules to provide a continuous, seamless, waterproof, weatherproof and electrically generating surface according to claim 5 wherein said adhesive is a fabric covered self adhesive tape.

7. The method of layering a roof using elastomeric weatherproofing building material coatings and photovoltaic modules to provide a continuous, seamless, waterproof, weatherproof and electrically generating surface according to claim 5 wherein said adhesive is applied to a bottom portion of said at least one photovoltaic module offsite.

8. The method of layering a roof using elastomeric weatherproofing building material coatings and photovoltaic modules to provide a continuous, seamless, waterproof, weatherproof and electrically generating surface according to claim 5 wherein said adhesive is applied to a bottom portion of said at least one photovoltaic module by an installer at an installation site.

* * * * *